United States Patent [19]

Mourou

[11] 4,347,437
[45] Aug. 31, 1982

[54] LIGHT ACTIVATED SWITCHING BY THE AVALANCHE EFFECT IN SEMICONDUCTORS

[75] Inventor: Gerard Mourou, Rochester, N.Y.
[73] Assignee: The University of Rochester, Rochester, N.Y.
[21] Appl. No.: 160,351
[22] Filed: Jun. 17, 1980
[51] Int. Cl.³ .............................................. H01J 40/14
[52] U.S. Cl. .............................................. 250/211 R
[58] Field of Search ................ 250/211 R, 211 J, 551; 357/29, 30, 13; 350/96.3; 307/311, 312

[56] References Cited

U.S. PATENT DOCUMENTS 3,626,188 12/1971 Chilton .............................. 250/211 J
3,917,943 11/1975 Auston .................................. 357/30
4,135,099 1/1979 Fiedor et al. ........................ 307/312

Primary Examiner—David C. Nelms
Attorney, Agent, or Firm—Martin Lukacher

[57] ABSTRACT

A body of semiconductor material is biased with multi-kilovolt voltage to establish an electric field approaching the dielectric breakdown field for the semiconductor material. Low level optical energy, such as a laser pulse in the nano-joule range produces free carriers in the semiconductor which multiply in the presence of the electric field to produce avalanche conduction through the semiconductor body thereby switching the multi-kilovolt voltage in precise timed (picosecond) relationship with the application of the optical energy and with high switching or turn on sensitivity.

36 Claims, 10 Drawing Figures

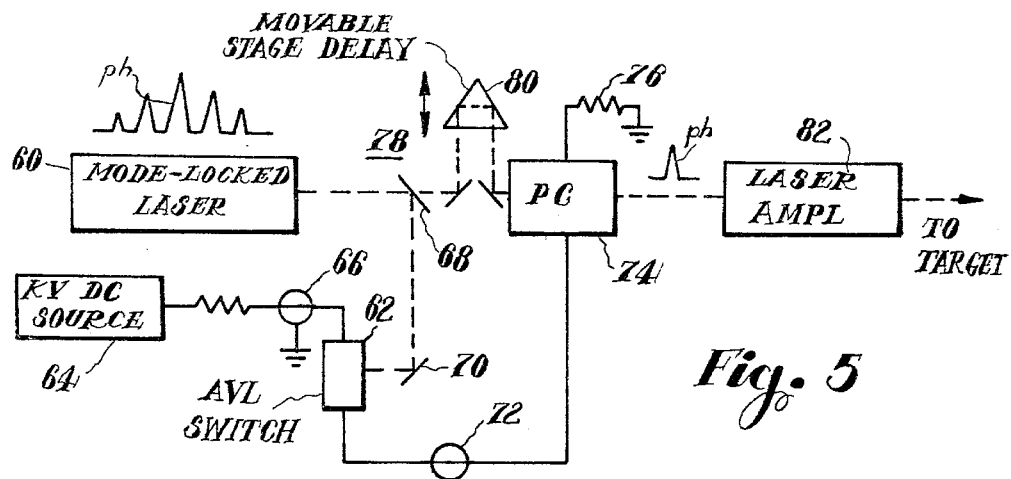
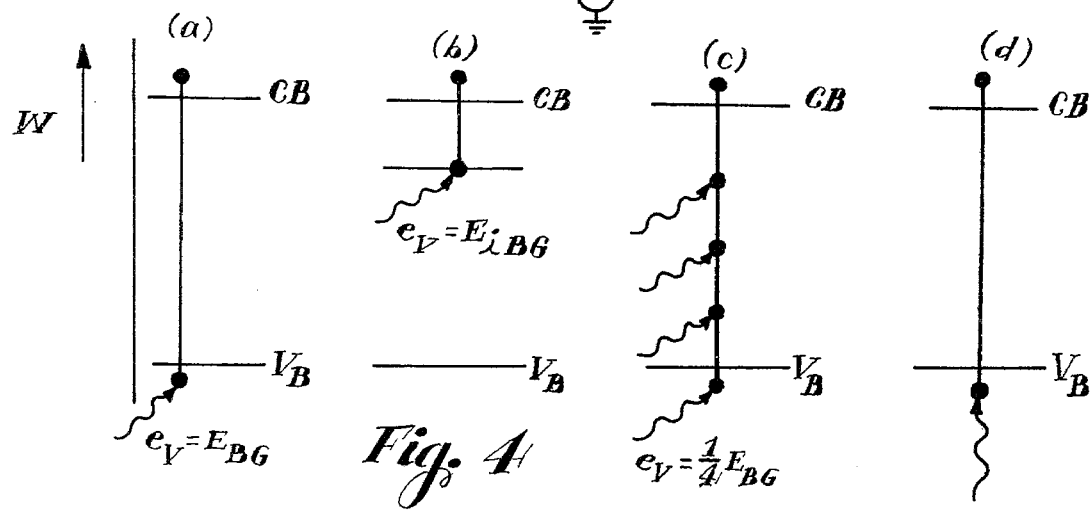
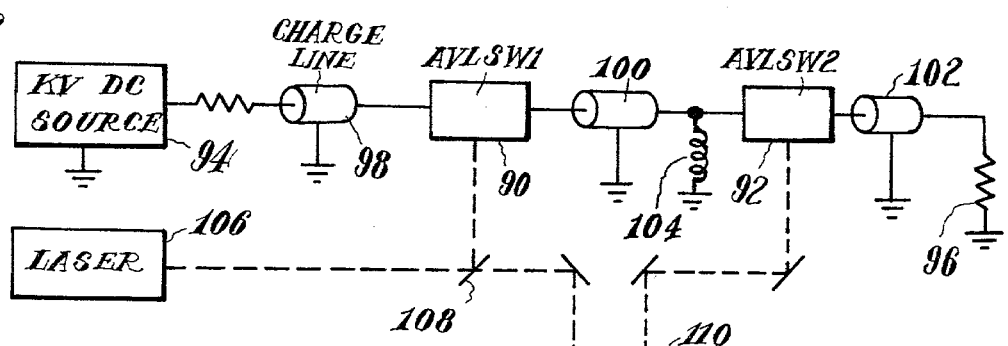
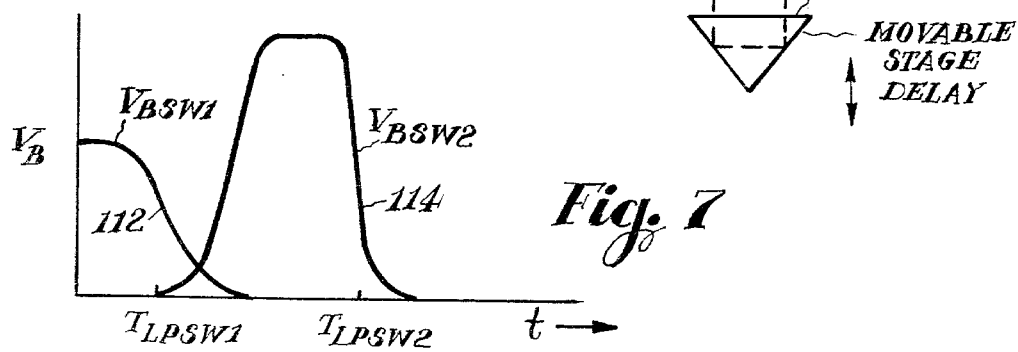

LIGHT ACTIVATED SWITCHING BY THE AVALANCHE EFFECT IN SEMICONDUCTORS

DESCRIPTION

The present invention relates to methods and apparatus for switching high voltages and generating high voltage pulses by activation of avalanche (impact ionization) conduction in semiconductor materials.

The invention is especially suitable for use in providing light activated, solid state high voltage switches capable of generating multi-kilovolt pulses with precision timing accuracy, amplitude stability and light amplitude discrimination ability. Such pulses may be used to operate electro-optic devices such as Kerr and Pockels cells, as in systems for switchout, suppression and selection of laser pulses in high power laser systems.

This invention is related to the inventions described in U.S. Patent application Ser. No. 13642 filed Feb. 21, 1979, by Gerard Mourou for Apparatus for Switching High Voltage Pulses with Picosecond Accuracy, now U.S. Pat. No. 4,218,618, issued Aug. 19, 1980, and in U.S. Patent application Ser. No. 96711, filed Nov. 21, 1979 by Gerard Mourou for Light Activated Solid State Switch, now U.S. Pat. No. 4,301,362, issued Nov. 17, 1981.

The above mentioned patent applications describe optically triggered, high voltage, solid state switches wherein a high density of charge carriers is induced by photoconduction so as to provide conduction through a body of solid state material. Such switches make possible the switching of pulse or DC high voltage in the multi-kilovolt range with picosecond accuracy of timing to the activating light pulse and with substantially no jitter. Reference is also made in the above identified patent applications to other work in the area of light activated solid state switches, namely, Auston, U.S. Pat. No. 3,917,943; LeFur and Auston, *Appl. Phys. Lett.* 28, 21 (1976); and Antonetti, Malley, Mourou, and Orszag, *Opt. Comm.*, 23, 435 (1977). In all of the semiconductors used for solid state switching as described in the above mentioned patent applications and references, conduction results from photoproduced carriers; the optical energy induces the high density of carriers which may be considered to be a high density carrier plasma, for example, $10^{17}$ and higher carriers per cubic centimeter. Optical energy in the micro-joule range, which is substantially matched for best sensitivity to the band gap energy, is required to obtain photoconduction and turn on the switch. It is a principal feature of this invention to enable light activating switching to be carried out in semiconductors with greater turn on or switching sensitivity. Optical energy in the nano-joule range is enough to obtain a high density of carriers for substantially full conduction (90% or more transmission) through the body of semiconductor material. Low level sources of optical energy, such as dye lasers and diode lasers, may be used to activate or trigger switching in accordance with the present invention, which is advantageous in many applications.

The high switching sensitivity is obtained through the use of the avalanche mode of operation whereby the optical activating energy is insufficient to produce enough carriers to materially affect the conductivity of the semiconductor. An electric field is established in the semiconductor which imparts enough kinetic energy to the few injected carriers so that additional carriers are generated by impact ionization. Multiplication of carriers takes place and an avalanche effect occurs so as to provide the requisite high concentration of carriers for full conduction without raising the temperature of the semiconductor.

Avalanche mode conduction requires more time than photoconduction to take place in the semiconductor. In the photoconductive mode, the switching results within the laser pulse duration, with carriers being photoproduced in femtoseconds ($10^{-15}$ seconds). The avalanche mode involves a buildup time which may range from a few hundred picoseconds to somewhat more than a nanosecond. The buildup time may be considered the time from the onset of the activating light to the half maximum amplitude point of the switched voltage. The rise time may be considered the time from the half maximum amplitude point to the maximum amplitude of the switched voltage. The buildup and rise times are taken along the leading edge of the switched voltage or pulse. The buildup time varies as $(\partial T/\partial E_o)_v$, that is with constant optical energy $E_o$, the buildup time, T, is a function of the field or bias voltage, v. Also the buildup time varies as $(\partial T/\partial E_o)_v$, that is with constant field or bias voltage the buildup time is a function of the optical energy. In other words, the buildup and rise time of the switched voltage has, in accordance with the invention, been found to be a function of the field (the voltage being switched) and the optical activating energy level. Accordingly, precise timing between the switching time and the time of occurrence of the optical energy may be obtained in accordance with the invention.

Another feature of the invention resulting from operation in the avalanche mode is optical intensity and/or optical energy level discrimination. Optical intensity or optical energy level discrimination can be obtained according to the carrier lifetime in the semiconductor. This carrier lifetime can be varied from picoseconds to microsecond in the semiconductor according to the material thereof and particularly the impurity concentration therein contained. Cr-doped GaAs with a relaxation time of an nanosecond or less acts as an energy discriminator for optical trigger pulses of the order of picoseconds and as an optical intensity discriminator for longer optical trigger pulses. Below a given level of optical energy or intensity of the activating light for a given electric field across the semiconductor, conduction does not occur. When, however, the intensity or energy level of the light exceeds a threshold, conduction and switching results. The output voltage, which may be in the form of a pulse, may be used to control an electro-optical device which switches out or prevents the transmission of the activating light until the intensity thereof exceeds a certain threshold level. Such switch out and suppression may be used to select optical pulses. Applications for such suppression may be found in amplifier chains, such as used in high power amplifiers in inertial confinement fusion systems.

It is, therefore, an object of the present invention to provide improved methods and apparatus for light activated switching in semiconductors in which an avalanche affect is optically triggered.

It is a further object of the invention to provide optically triggered avalanche switching in semiconductors which is capable of switching high voltages, as in the kilovolt range, without limitation by thermal runaway.

It is a still further object of the present invention to provide improved solid state switching methods and apparatus capable of switching high power, for example megawatts—voltages in the kilovolt range applied to a fifty ohm load—with high duty factor and long pulse durations.

It is a still further object of the invention to provide improved light activated switching methods and apparatus having enhanced switching or turn on sensitivity such that energy in the nano-joule range may be used to obtain full conduction.

It is a still further object of the invention to provide improved light-activated solid state switching methods and apparatus in which picosecond accuracy of switching is maintainable.

It is a still further object of the invention to provide improved solid state optically activated switching methods and apparatus which may be operated in the avalanche mode or in the photoconductive mode depending upon the energy level of the activating optical energy.

It is a still further object of the present invention to provide improved light activated semiconductor switching methods and apparatus which may be operated as an optical intensity or energy level discriminator, without special circuits or devices, for example as a discriminator against low level optical pulses and which can block or switch out such pulses.

It is a still further object of the present invention to provide improved light activated solid state switching methods and apparatus capable of generating a high voltage output pulse with minimal fluctuations in the peak amplitude thereof.

It is a still further object of the present invention to provide improved light activated solid state switching methods and apparatus which is not restricted by carrier recombination time in the generation of high voltage pulses with desired pulse widths.

It is a still further object of the present invention to provide improved light activated solid state switching methods and apparatus in which controllable delay between an electrical output pulse and a triggering optical pulse may be obtained by controlling the level of the optical triggering energy and the voltage level applied to the semiconductor.

Briefly described, the methods and apparatus provided by the invention for switching high voltages make use of a body of semiconductor material. The voltage to be switched applies an electric field across the body. The field intensity is a predetermined magnitude below that for dielectric breakdown in the body. Optical triggering energy is applied to the body having a level in such relationship to the predetermined field magnitude that conduction by avalanche multiplication occurs in the body and enables the switching of the high voltage therethrough.

The foregoing and other objects, features and advantages of the invention, as well as presently preferred embodiments and the best known modes of practicing the invention, will become more apparent from a reading of the following description in connection with the accompanying drawings in which:

FIGS. 4a, 4b, 4c and 4d are a series of energy level diagrams illustrating different mechanisms which may be used to generate carriers in the semiconductor of switching apparatus in accordance with the invention, which carriers trigger avalanche mode conduction therein;

FIG. 5 is a block diagram schematically illustrating apparatus for suppressing and switching out the laser pulses in accordance with the invention;

FIG. 6 is a block diagram illustrating a system for generating output pulses with fast rise times in accordance with the invention; and FIG. 7 are wave forms illustrating the operation of the apparatus shown in FIG. 6.

Figure 1:
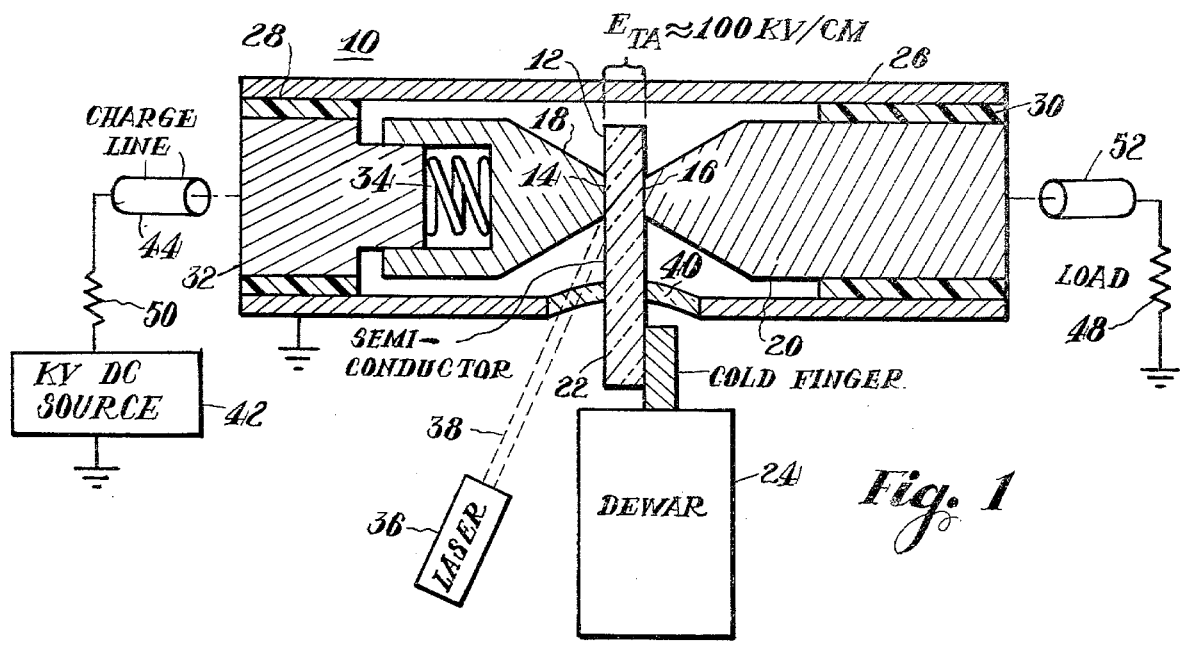
FIG. 1 is a diagram schematically illustrating a solid state switch embodying the invention.

Referring first to FIG. 1, there is shown a light activated solid state switch 10. Switching is obtained by avalanche mode conduction in a body 12 of semiconductor material. The body 12 is a slab. A rectangular slab, approximately one centimeter long, five millimeters wide and five hundred microns thick has been found suitable. The slab has opposite faces, 14 and 16, across which a bias field is applied by electrodes 18 and 20 which are in contact with the opposite faces. The area of the electrodes, which are in contact with the opposite faces 14 and 16, are suitably of diameter approximately equal to the thickness of the slab 12 or less. A 200 micron diameter has been found suitable for the contact areas. The electric field, $E_{TA}$, across the bulk of the body 12 is used, while breakdown along the surface is inhibited by virtue of the geometry. While a rectangular slab is shown in this example, other configurations of the body 12, such as disks, may be alternatively used.

The semiconductor presently preferred is gallium arsenide (GaAs) doped with chromium (Cr) to a concentration of from $10^{16}$–$10^{17}$ atoms per cubic centimeter. The semiconductor material used may have deep lying charge carrier trapping centers (lying in the middle of the energy gap of the semiconductor material). Such trapping centers are obtained by doping the material with a deep lying impurity which, in the case of GaAs, chromium is one example. As explained in the above referenced patent application Ser. No. 96711, filed Nov. 21, 1979, the resistivity of the body 12 is increased by maintaining the body 12 at cryogenic temperature. This is a temperature, for example, from $-40°$ C. to lower temperatures. Liquid nitrogen temperature (77° K.) is presently preferred. Maintaining the body at cryogenic temperature may be carried out by connecting the body to a cold finger 22 which projects from a dewar 24 containing liquid nitrogen. The entire switch assembly 10 and the dewar may be located in an evacuated cryogenic chamber to enhance the cooling of the body 12. The cold finger 22 is in conductive contact with the body, as by being clamped or thereto, or bonded thereto by a conductive epoxy. The deep lying charge carrier trapping centers, by limiting the carrier mean free path, maintain the high voltage (multikilovolt range) holdoff characteristics of the body, while the cooling thereof cryogenic temperature lowers the resistivity thereof to and inhibits thermal breakdown or runaway effects. Avalanche mode conduction does not raise appreciably the temperature of the body before full conduction and switching therein takes place. Thermal runaway occurs after impact ionization, not before. Accordingly, thermal runaway is not a factor in the operation of the solid state switch 10. The switch may also operate with pulsed bias voltages to avoid thermal runaway effects (see above referenced patent application Ser. No. 13642).

As mentioned above, while GaAs doped with Cr, as the deep lying impurity, is the presently preferred semiconductor material; other materials may be used, for example, silicon, preferably doped with gold (Au), as the deep lying impurity. The concentration of Au should exceed $10^{15}$ atoms per cubic centimeter. Still other semiconductor materials, which may be used to provide the body 12, are germanium (Ge) doped with such a deep lying impurity as silver (Ag), manganese (Mn), cobalt (Co) and the like. Other dopants, than gold, which may be used to provide the deep lying impurity in silicon, are iron, zinc and the like. GaAs may also be doped with oxygen. The semiconductor material may also be indium phosphate (InP) doped with chromium or oxygen.

The switch is arranged in a coaxial transmission line configuration so as to be able to handle and transmit pulses with very rapid rise times in the picosecond range. To this end, a cylindrical conductive shell 26 supports the electrodes 18 and 20, which themselves are generally cylindrical, within insulating sleeves 28 and 30. The electrode 18 may have a back section 32 in which the front section is slidable into contact with the face 14 of the body 12 and biased to make good contact by means of a spring 34.

The activating light may be obtained from a laser 36, the output beam 38 of which passes through an opening 40 in the shell 26 and is incident on one of the faces 14 of the body 12. The mechanisms for the photoproduction of carriers by the optical energy from the laser 36 will be described hereinafter in connection with FIG. 4. The carriers are optically implanted or seeded in sufficient number only to trigger avalanche conduction through the bulk of the body between the electrodes 18 and 20. This energy is of a level much less than that needed for photoconduction through the body and may be less than one micro-joule for example in the range of tens of nano-joules. The carriers, which are produced in the body, multiply by impact ionization in the presence of the electric field to produce avalanche conduction. This multiplication is, in effect, an internal gain in the body of two to four orders of magnitude and results in a carrier density of $10^{17}$ to $10^{18}$ carriers/cubic centimeter. This carrier density (or concentration) provides full conduction (at least 90% transmission) through the switch 10.

Figure 3:
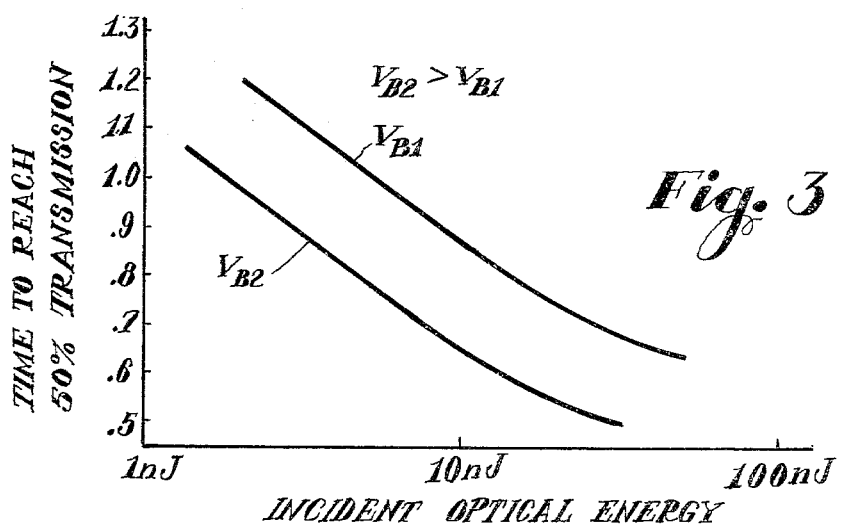
FIG. 3 are curves illustrating the relationship between the bias voltage, optical triggering energy and the output pulse buildup or switching time in switching apparatus provided in accordance with the invention.

The operating field across the body is obtained from a kilovolt DC source 42 which is connected through a switch electrode, which is shown to be the electrode 18, by means of a transmission line 44 which functions as a charge line so that the apparatus is operative to generate pulses at a load 48, schematically shown as a resistor. The charge line 44 is terminated at the source 42 by a resistor 50. A charging resistor, not shown, may be usd to limit the current flow and protect the load, the switch 10 and the rest of the apparatus in the event of a failure by limiting the current flow. The charge line length 44 determines the width of the pulse which is produced when a laser pulse is applied to the body 12 to initiate switching in the device 10. The load is connected to the other electrode 20 of the switch 10 by a transmission line 52. The load impedance is desirably matched to the output impedance of the line 52 which is also matched to the impedance of the device 10 and the charge line 44. The load may, for example, be a Pockels cell, Kerr cell, framing camera, gating tube or streak camera, which is to be operated by the high voltage pulse generated after the laser light pulse activates the device 10. The electric field, $E_{TA}$, requisite to obtain operation in the avalanche mode, is due to the bias voltage from the DC source 42. The magnitude of this voltage is selected to be sufficiently high to result in avalanche multiplication for the optical energy which is applied to the body 12. The exact magnitude of the voltage applied to the body may be determined experimentally in the absence of any activating light. The voltage applied across the body 12 is increased until avalanche occurs. This voltage may be the self-avalanche threshold for the applied electric field. Then the bias voltage is then reduced below the self-avalanche threshold to a voltage where avalanche conduction occurs for the activating light intensity to be used in the operation of the switch. That bias voltage is then maintained. Both the bias voltage and the activating light energy may be controlled in order to control the turn on or switching of the device 10. The delay time (the buildup and rise time of the switched voltage) depends on the bias voltage and optical magnitude seeding energy level as illustrated in FIG. 3.

Figure 2:
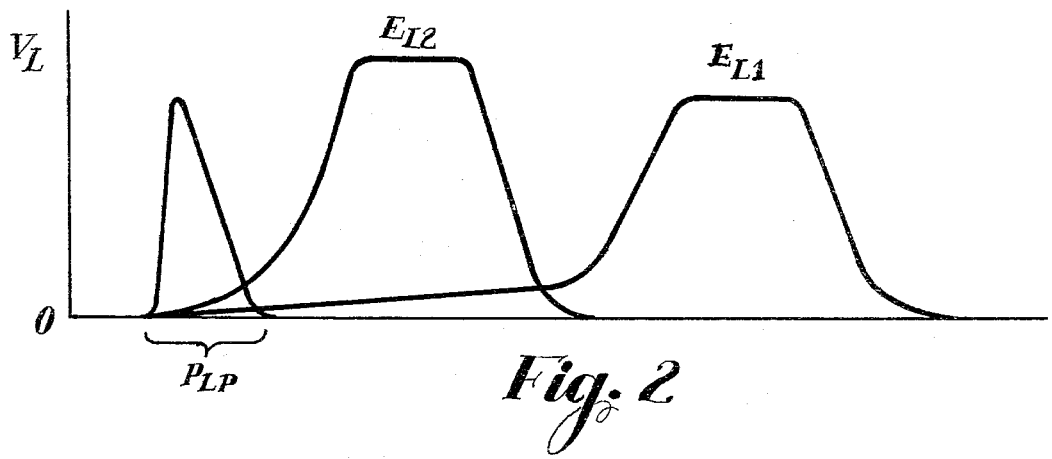
FIG. 2 is a diagram of wave forms which illustrate the operation of the switching apparatus shown in FIG. 1.

The operating characteristics of the switch 10, as shown by the output pulse produced at the load 48, is illustrated in FIG. 2. Consider that the light from the laser 36 is a pulse having a duration $P_{LP}$. In the event that the photoconductive mode of operation were effective in providing the switching through the device 10, all of the carriers would be optically generated. This would occur at much lower switching sensitivity; for example, a laser pulse with an energy in the micro-joule range, say over 100 micro-joules, is then required. Photoconduction occurs only while the optical energy is incident on the semiconductor, that is, for the duration of the light pulse $P_{LP}$ and the recombination time for the carriers. The conductivity of the body 12 is dependent upon the exciting optical energy and, thus, the output pulse is subject to some shot to shot (viz., optical activating pulse to pulse) amplitude fluctuation, especially when the gap in the body between the electrodes 18 and 20 is not fully saturated with photoproduced carriers. The rise time of the pulse produced during the photoconductive mode (PC mode) is dictated in first approximation by the laser pulse duration and is synchronous with the timing of the light pulse with picosecond accuracy and picosecond jitter in the rise time.

Pulses are shown in FIG. 2 which are obtained during avalanche mode conduction for two output voltages $E_{L1}$ and $E_{L2}$, which correspond to the bias voltages of lower and higher magnitude, respectively. In the avalanche mode, a low density of carriers is generated by the light pulse. The electrical onset of the electrical output pulse, that is, the buildup time or the time to reach essentially full conduction (90% transmission) through the device, varies with the bias voltage and the incident optical energy from the activating light pulse. The same bias voltage, which produced the photoconductive mode of operation (output voltage $E_{L1}$), results in an output pulse after a buildup time which is longer than the buildup time to produce the output pulse of higher level $E_{L2}$ for the higher bias voltage. The buildup time is, however, directly related to the bias voltage and the optical energy and precise timing is, therefore, obtainable. One only has to accommodate for the delay due to the buildup time. For example, the buildup time is predictable within a few picosecond.

The period of the pulse depends upon the width of the pulse produced by the charge line 44. Avalanche conduction continues even in the absence of the optical pulse, so long as the charge line is not fully exhausted (no field across the gap between the electrodes, 18 and 20 (FIG. 1). The pulse width of the output pulse, therefore, is the same regardless of the bias voltage.

Inasmuch as kilovolts are switched to a load, megawatts of power are handled by this device 10. For example, more than one megawatt of power is handled with 3 nano-joules of absorbed optical energy (1.06 micron wavelength, 30 picosecond duration optical pulse), which is incident upon a body of chromium doped gallium arsenide, as may be used in the presently preferred embodiment of the invention illustrated in FIG. 1. The rise time of the electrical output pulse and its buildup time is approximately 900 picoseconds to reach full conduction. In the photoconductive mode over 1,000 times the activating optical energy would be required to switch the same power. However, switching would occur much more rapidly, say within 30 picoseconds.

The interrelationship between the bias voltage, $V_{B1}$, the incident optical energy and the buildup time or time to reach 50% transmission through the switch, is illustrated in FIG. 3. For the higher bias voltage, $V_{B2}$, the buildup time is reduced for the same incident optical energy. In all cases the optical energy is extremely low and may be obtained from a laser diode, dye laser and other low power coherent radiation generators, a large variety of which are capable of producing pulses in the nano-jougle range.

Referring next to FIG. 4, there is shown in each of the energy level diagrams therein, the upper and lower edges of the valence band (VB) and the conduction band (CB) of the semiconductor material used in the body of semiconductor material in the switching device 10. In order to photoproduce carriers in the conduction band, sufficient energy must be absorbed by an electron in the valence band or an impurity level to lift it above the band gap into the conduction band. In diagram (a), a photon of optical energy is absorbed by a valence band electron. This photon, indicated by the wavy line in FIG. 4(a), has an energy equal or exceeding the band gap energy (the difference in energy levels between the bottom of the conduction band and the top of the valence band) sufficient to move the electron into the conduction band. One photon is absorbed by each electron. To have sufficient energy $E_v$, the frequency of the optical energy must be such that Hu which is the photon energy, is greater than $E_{bg}$ which is the band gap energy. Planck's constant is represented by H and u is the frequency of the optical energy expressed in sec.$^{-1}$ For GaAs, a laser such as a Nd:YAG laser or a Nd:glass laser, which produces output radiation at 1.06 micron wavelength has an energy approximately equal to the band gap energy $E_{bg}$ of the semiconductor material. Accordingly, the triggering carriers are produced by absorption of approximately one photon for each carrier and the triggering carriers are produced by band-to-band photoconductivity.

It may be desired to use optical energy of longer wavelengths and lower frequency than that produced by a laser medium containing Nd as the active element, such for example, as 10 micron radiation as may be produced by a carbon dioxide laser. In such event, the semiconductor may be doped with an impurity having an energy level which lies close to the conduction band (or valence band). This energy level is indicated as $E_i$. The band gap energy $E_{ibg}$ is then satisfied by photons of light having a wavelength longer than 1.06 microns. The photons of this energy then raise electrons of the impurity into the conduction band so as to trigger the avalanche mode of operation. By way of an example, a semiconductor material such as extrinsic germanium may be doped with an impurity such as Hg, Cu, Zn or Au having levels located near the valence or conduction band may be used. The band gap energy between the impurity level and the conduction band is then such that photons of 10 micron laser light will photoproduce the carriers which trigger the avalanche. The impurity levels in the Hg, Cu, Zn or Au doped germanium may be located a few tenths of an electron volt from the germanium conduction or valance band. InSb may also be suitable.

In order to enhance the resistivity of these semiconductors, cryogenic temperatures very low (e.g. a few degrees Kelvin) may be used with magnetic fields (e.g. 0.5 webers per square meter). This effect is called magnetic freeze out. At such low temperatures, lead, tin and mercury cadmium chalcogenides may also be used as the semiconductor. Pulse bias voltage as well as low temperatures can also be used to avoid thermal runawy with semiconductors have small band gap energies.

The triggering carriers may also be produced by multi-photon absorption as illustrated in FIG. 4(c). Again, the photons may result from laser light having less energy than the band gap energy of the semiconductor. In the illustrated case, FIG. 4(c), four photons are used to raise an electron from the valence to the conduction band. Such multi-photon absorption has been observed and is reported in Jayaraman and Lee, *J. Appl. Phys.*, 44, 5480 (1973).

Where the laser light is sufficiently strong to provide an optical energy field which is greater than the destructive breakdown energy of the semiconductor material, electrons may be transferred from the valence to the conduction band by optically induced ionization in the semiconductor material. This effect is illustrated in energy level diagram (d) in FIG. 4 where the optical field is greater than the breakdown field of the material. This affect has been reported in Faradin, Bloembergen and Letellier *Appl. Phys. Lett.*, 22, 635 (1973). At the present time, band-to-band transitions or impurity level to conduction band transitions by absorption of photon energy from the acitivating light source is the preferred mode practicing the invention inasmuch as lower optical energy levels and intensities may be used to enable switching in the device.

Referring next to FIG. 5, there is shown apparatus in accordance with the invention for switching out pulses in a train of pulses which is transmitted from a laser oscillator to laser amplifiers for amplification therein. The output beam may be applied to a target such as in an inertial confinement fusion device. The laser oscillator may be a mode locked laser 60 which produces a train of pulse of increasing amplitude when pumped. An avalanche switch 62, such as described in FIG. 1, generates a pulse by switching high voltage from a DC source 64 which is applied thereto via a charge line 66 when the high amplitude pulse $p_h$ occurs. The laser light is reflected to the switch by a partially reflecting mirror 68 and a mirror 70. The initial or prepulses are not of sufficient energy level (they are lower intensity than necessary) to photoproduce, in the semiconductor body of the switch 62, enough carriers to trigger avalanche conduction. However, the high amplitude pulse $p_h$ produces sufficient carriers and avalanche conduction follows after a buildup time. The resulting pulse is transmitted through a transmission line 72 to a Pockel cell 74, the output of which is returned to ground via a resistor 76. To accommodate the delay due to the buildup time of the electrical pulse in the avalanche switch 62 after occurrence of the optical pulse $p_h$, an optical delay 78 is provided by means of a prism 80 which is movable to obtain the optical path length necessary for the delay. The Pockel cell then transmits only upon occurrence of the peak amplitude laser pulse $P_h$ and the prepulses are suppressed prior to being applied to the laser amplifier 82 for amplification therein.

Referring to FIG. 6, there is shown apparatus using two avalanche switches 90 and 92 (AVLSW1 and AVLSW2). These switches are connected in series between a kilovolt DC source 94 and the load 96. A transmission line 98, which operates as a charge line, provides pulse electrical energy. A transmission line 100 interconnects the switches 90 and 92, and another transmission line 102 connects the output of the second switch to the load 96. An inductor 104 provides a high impedance path to ground for the picosecond rise time of the pulse generated when the first switch 90 is activated and a DC return path ground through the first switch 90 so that the bias voltage appears across the semiconductor body therein. A laser 106 provides an optical pulse to trigger the first switch. This optical pulse passes through a partially reflecting mirror 108 and a variable time delay stage 110, shown as a movable prism stage which provides the variable delay. The delayed optical pulse is then applied to the second switch 92.

FIG. 7 illustrates the voltage across the first switch, which is indicated as $V_{BSW1}$. The wave form $V_{BSW2}$ shows the voltage across the second switch 92. Upon occurrence of the laser pulse at $t_{LTSW1}$, that pulse is applied to the first switch 90 and produces avalanche conduction therein with a relatively slow buildup time as indicated on the lagging edge 112 of the wave form $V_{BSW1}$. The electrical pulse propagates along the transmission line 100, and upon reaching the body of semiconductor material in the second switch 92, is reflected therefrom. Because of the reflecting surface, the transmission line effect results in a higher voltage than the actual bias voltage due to the DC source 94 at the second switch. During the period of this higher or over voltage, the optical pulse reaches the second switch 92 at $t_{LTSW2}$. Inasmuch as an over bias voltage is present across the second switch 92, the buildup time and rise time of the avalanche is much faster than was the case at the first switch 90. FIG. 7 shows that the lagging edge 114 of the voltage across the second switch $V_{BSW2}$ has a faster fall time than is the case for the lagging edge 112 of the pulse across the first switch 90. This lagging edge appears as the leading edge of the pulse across the load 96. Accordingly, the output electrical pulse has a faster rise time by virtue of the system shown in FIG. 7.

From the foregoing description, it will be apparent there has been provided improved light activated switching methods and apparatus capable of switching very high voltages with high switching sensitivity and accuracy of timing. Variations and modifications in the herein described methods and apparatus, within the scope of the invention, will undoubtedly suggest themselves to those skilled in the art. Accordingly, the foregoing description should be taken as illustrative and not in a limiting sense.

I claim:

1. The method of switching high voltages with the aid of a body of semiconductive material which comprises the steps of applying, with said voltage to be switched, an electrical field across said body having a predetermined magnitude below that for bulk dielectric breakdown therein, and applying optical energy to said body of levels in such relationship to said predetermined field magnitude that conduction by avalanche multiplication occurs in said body and enables switching therethrough.

2. The method as set forth in claim 1 wherein said optical energy is of level at least equal to the band gap of said material so as to photoproduce carriers in said body by transfer thereof between the valence and conduction bands thereof.

3. The method as set forth in claim 1 wherein said body contains an impurity having an energy level between the valence and conduction bands of the material of said body and wherein said optical energy level is at least equal to the gap between said impurity energy level and the conduction band level in said material so as to produce photocarriers in said body.

4. The method as set forth in claim 1 wherein said optical energy is of such level that a multiplicity of photons thereof have sufficient energy to transfer carriers between the valence and conduction bands thereof by multi-photon absorption of energy between the valence and conduction bands thereof to photoproduce carriers in said body.

5. The method as set forth in claim 1 wherein said optical energy is of such level as to photoproduce carriers in said body by ionization therein.

6. The method as set forth in claim 1 further comprising the steps of increasing the resistivity of said body to suppress thermal carrier excitation in said body.

7. The method as set forth in claim 6 further comprising the step of increasing the dielectric breakdown field strength of said material.

8. The method as set forth in claim 6 wherein said resistivity increasing step is carried out by cooling body to a cryogenic temperature.

9. The method as set forth in claim 7 wherein said resistivity increasing step is carried out by cooling said body to a cryogenic temperature and said dielectric breakdown increasing step is carried out by doping said material with a certain concentration of impurities which provide deep lying charge carrier trapping centers therein.

10. The method as set forth in claim 1 wherein said predetermined electrical field magnitude is obtained by increasing said field magnitude without application of said optical energy to said body until avalanche conduction occurs therein at a certain threshold field, and then decreasing said field magnitude below said threshold such that avalanche conduction occurs only after said optical energy is applied thereto.

11. Apparatus for switching high voltage from a source thereof to a load which comprises a body of semiconductor material, means for connecting said body between said source and said load to obtain an electric field across said body below the threshold for avalanche conduction therethrough, and means for activating avalanche conduction through said body with optical energy incident on said body of level less than for photoconduction needed to produce substantially full transmission therethrough.

12. The invention as set forth in claim 11 which comprises means for varying the relative levels of the intensity of said optical energy and the voltage from said source to control the time for substantially full transmission through said body after said optical energy is incident thereon.

13. The invention as set forth in claim 11 wherein said activating means comprises means for applying laser light of energy level less than one micro-joule to said body.

14. The invention as set forth in claim 11 wherein said activating means comprises means for applying laser light to said body having a frequency such that the energy of a photon thereof is at least equal to the band gap energy of said semiconductor material to result in the production of carries which multiply in the presence of said electric field to produce said avalanche conduction.

15. The invention as set forth in claim 11 wherein said semiconductor material has an impurity therein to provide an energy gap between the energy level of said impurity and said conduction band in said material which is less than the band gap energy of said material, and wherein said activating means comprises means for applying to said body laser light having a frequency such that the energy of a photon thereof is at least equal to said energy gap between said impurity level and said conduction band level to result in the production of carriers which multiply in the presence of said electric field to produce said avalanche conduction.

16. The invention as set forth in claim 11 wherein said activating means comprises means for applying laser light to said body of such frequency that the energy of a plurality of photons thereof equals the band gap energy of said material whereby carriers are produced by multi-photon absorption in said material which multiply in the presence of said electric field to produce said avalanche conduction.

17. The invention as set forth in claim 11 wherein said activating means comprises means for applying laser light to said body so as to produce ionization in part of said material which produces free carriers which multiply in the presence of said electric field to produce said avalanche conduction therein.

18. The invention as set forth in claim 11 wherein means are provided for increasing the resistivity of said body above the inherent resistivity of said semiconductor material thereof at room temperature.

19. The invention as set forth in claim 18 wherein said resistivity increasing means comprises means for cooling said body to a cryogenic temperature.

20. The invention as set forth in claim 19 wherein said body has a predetermined concentration of charge carrier trapping centers for increasing the magnitude of the field which produce dielectric breakdown therein.

21. The invention as set forth in claim 20 wherein said material is GaAs doped with an impurity which provides said charge carrier trapping centers.

22. The invention as set forth in claim 21 wherein said impurity is Cr.

23. The invention as set forth in claim 20 wherein said material is Si doped with an impurity which provides said charge carrier trapping centers.

24. The invention as set forth in claim 23 wherein said impurity is Au.

25. The invention as set forth in claim 20 wherein said material is selected from the group consisting of Ge, Si, GaAs and InP, and said charge carrier trapping centers are provided by an impurity having a concentration of at least about $10^{15}$ atoms of said impurity/cubic centimeter.

26. The invention as set forth in claim 11 wherein said body is a slab of said material having opposite faces separated by the thickness of said slab, said connecting means comprising electrodes opposed to each other in contact with said opposite faces, and said activating means comprises means for applying laser light onto at least one of said opposite faces.

27. The invention as set forth in claim 26 further comprising means surrounding said electrodes and body for defining a transmission line for pulses with submicronanosecond rise times through said electrode and body.

28. The invention as set forth in claim 26 wherein said source provides such high voltage that said electric field across the thickness of said body in the absence of conduction is about 100 Kv/cm.

29. The invention as set forth in claim 26 wherein means are conductively coupled to said slab for cooling said slab to a cryogenic temperature to increase the resistivity thereof.

30. The invention as set forth in claim 29 wherein said material is doped with an impurity providing an concentration of deep lying trapping centers of at least $10^{15}$/cubic centimeter to increase the dielectric strength of said cryogenic temperature and decrease the carrier recovery time.

31. Apparatus for amplitude discrimination of laser light pulses having different amplitude in a train of such pulses which propogates along a path, said apparatus comprising control means in said path responsive to the presence of high voltage for transmitting laser light to an output, a body of semiconductor material, a source of high voltage connected to said control means through said body, for applying an electric field across said body for avalanche multiplication of charge carriers therein produced when said body is illuminated by laser light of at least a certain threshold intensity, and means for illuminating said body with said laser light whereby to apply said high voltage to said control means coincidentally with the transmission of a laser light pulse in said train which is greater than said threshold intensity.

32. The invention as set forth in claim 31 further comprising means in said path for relatively delaying the time for transmission of said laser light to said control means with respect to the time for transmission of said laser light to said body.

33. The invention as set forth in claim 32 wherein said control means is a Pockels cell.

34. Apparatus for switching high voltages and generating a high voltage pulse with fast rise time at a load, said apparatus comprising a first solid state avalanche switch, a second solid state avalanche switch, said switches each including bodies of semiconductor material, a source of high voltage, a charge line, said source being connected to said first switch through said charged line, a transmission line connecting said first and second switches, said second switch being connected to said load, and means for applying optical energy to trigger avalanche conduction sequentially in said first and second switches with the time delay between said avalanche conduction in said first switch being at least equal to the electrical propagation time between said switches along said transmission line interconnecting them such that the voltage across the body of semiconductor material in said second switch at the time of avalanche conduction therein is greater than the voltage across the body of semiconductor material in said first switch.

35. The invention as set forth in claim 34 wherein said optical energy applying means comprises a laser for generating optical energy of intensity sufficient to trigger avalanche conduction in said switches, means for optically delaying the transmission of said light from said laser, and means for directing light from said laser and from said delay means to said first and second switches respectively.

36. The invention as set forth in claim 11 wherein said semiconductor material is selected from Ge, having an impurity level lying near the valence or conduction band, InSb, Pb, Sb and HgCd chalcogenides.

* * * * *